(12) United States Patent
Sagawa et al.

(10) Patent No.: US 8,368,825 B2
(45) Date of Patent: Feb. 5, 2013

(54) DISPLAY DEVICE AND ELECTRONIC APPARATUS

(75) Inventors: Hiroshi Sagawa, Kanagawa (JP); Yuuki Seo, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 339 days.

(21) Appl. No.: 12/468,221

(22) Filed: May 19, 2009

(65) Prior Publication Data

US 2009/0288865 A1 Nov. 26, 2009

(30) Foreign Application Priority Data

May 20, 2008 (JP) ................................. 2008-131664

(51) Int. Cl.
*G02F 1/1343* (2006.01)
(52) U.S. Cl. ............................................ 349/38; 349/39
(58) Field of Classification Search .................. 349/38, 349/39, 139; 313/504, 506; 315/169.3
See application file for complete search history.

(56) References Cited

U.S. PATENT DOCUMENTS

| 6,882,105 B2 * | 4/2005 | Murakami et al. ............ 313/506 |
| 2004/0070808 A1 * | 4/2004 | Nakanishi ..................... 359/245 |

FOREIGN PATENT DOCUMENTS

| JP | 01-129234 | 5/1989 |
| JP | 10-214042 | 8/1998 |
| JP | 2004-191627 | 7/2004 |
| JP | 2005-321815 | 11/2005 |
| JP | 2006-011059 | 1/2006 |
| JP | 2007-035964 | 2/2007 |

OTHER PUBLICATIONS

Japanese Office Action issued on Oct. 5, 2010, in connection with counterpart JP Application No. 2008-131664.
Japanese Patent Office Action corresponding to Japanese Serial No. 2008-131664 filed Apr. 20, 2010.

* cited by examiner

*Primary Examiner* — Edward Glick
*Assistant Examiner* — David Chung
(74) *Attorney, Agent, or Firm* — SNR Denton US LLP

(57) ABSTRACT

A display device includes an anode electrode provided for each pixel, an opening insulation film which covers the periphery of the anode electrode and which defines an pixel opening, and a storage capacitor disposed below the anode electrode through a planarizing insulation film, having a function to store charge for driving a pixel, and including capacitor electrodes wider than the pixel opening.

2 Claims, 16 Drawing Sheets

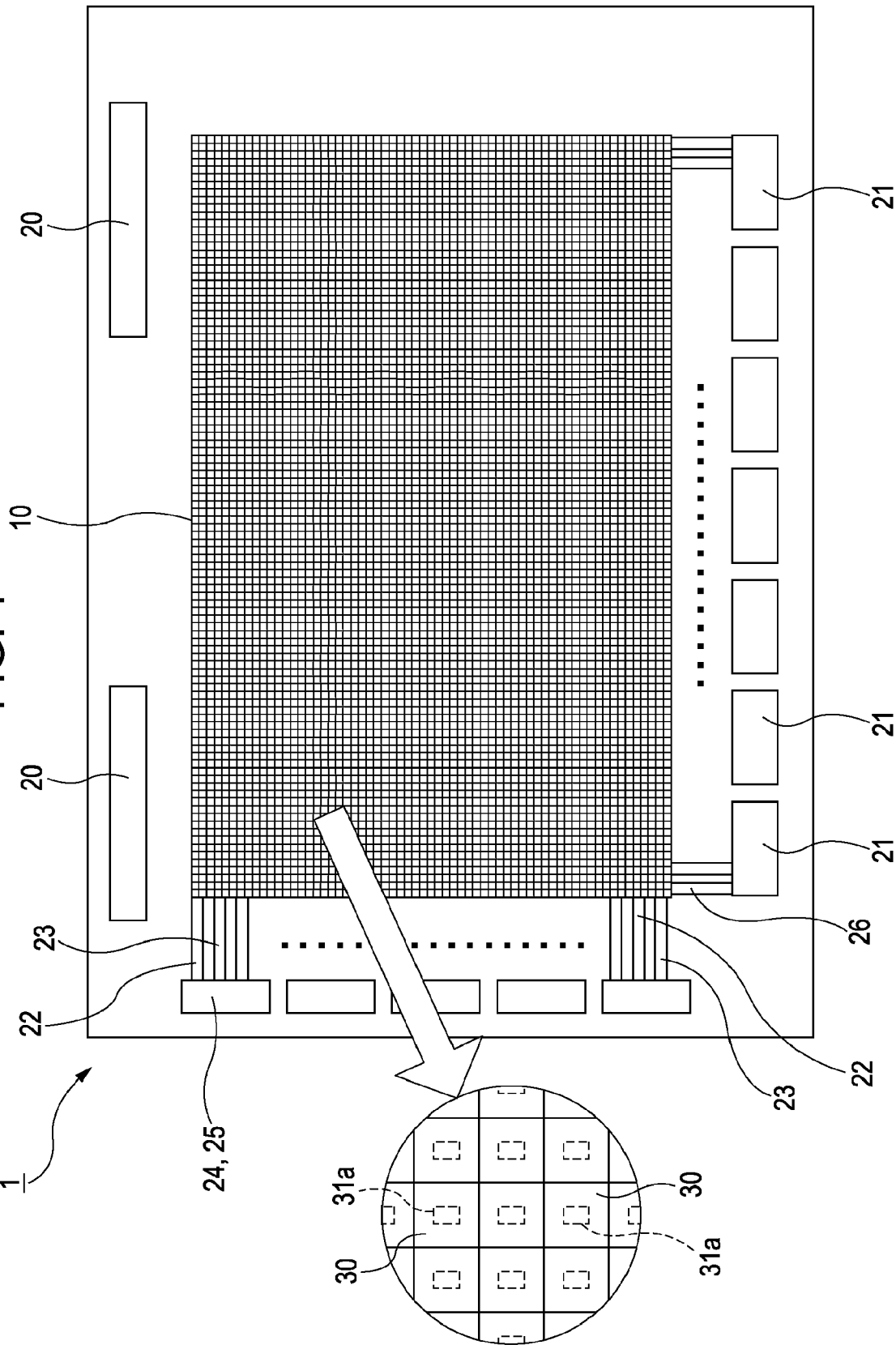

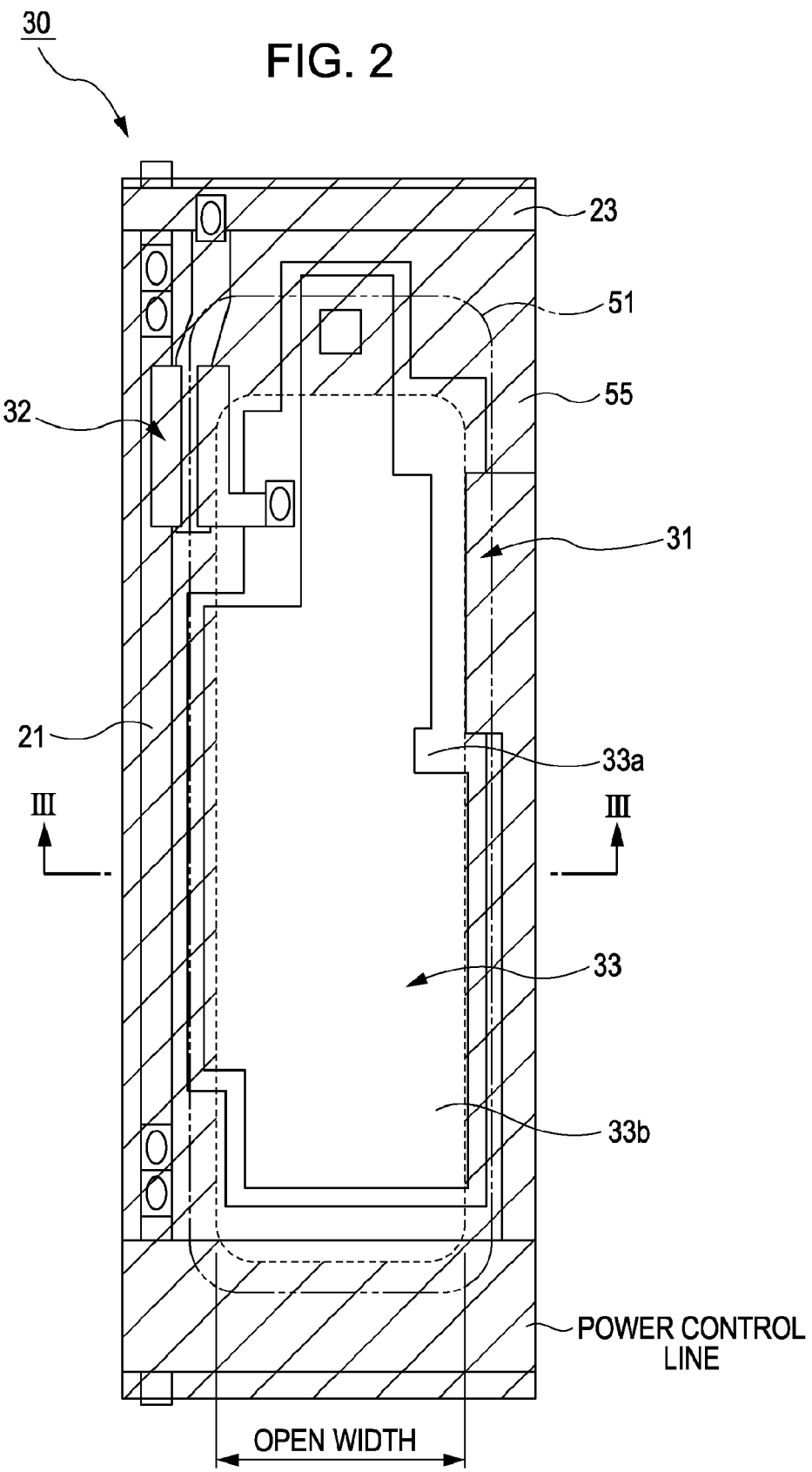

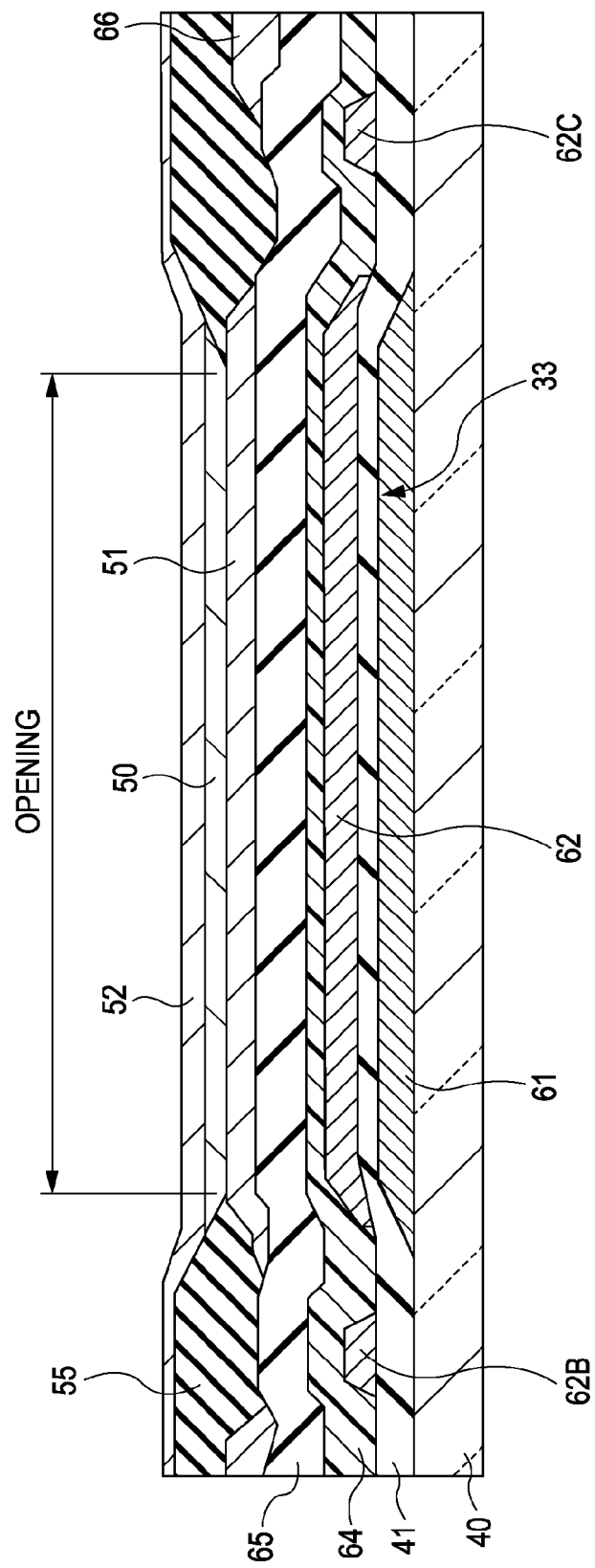

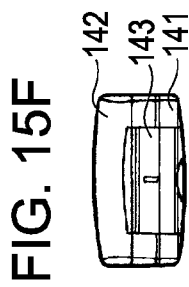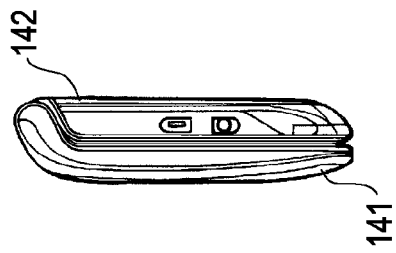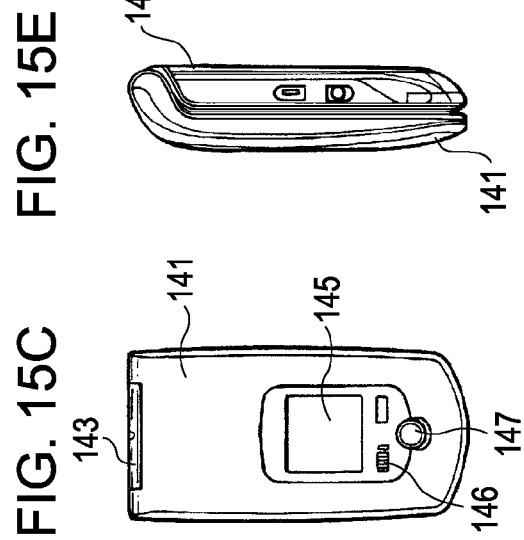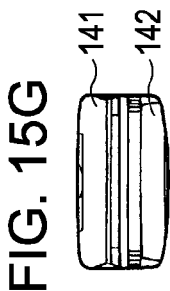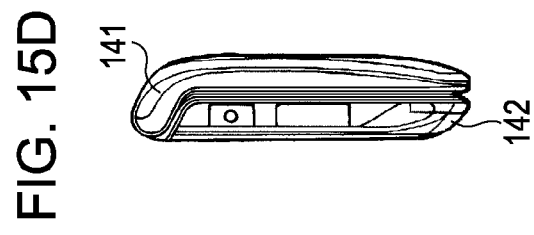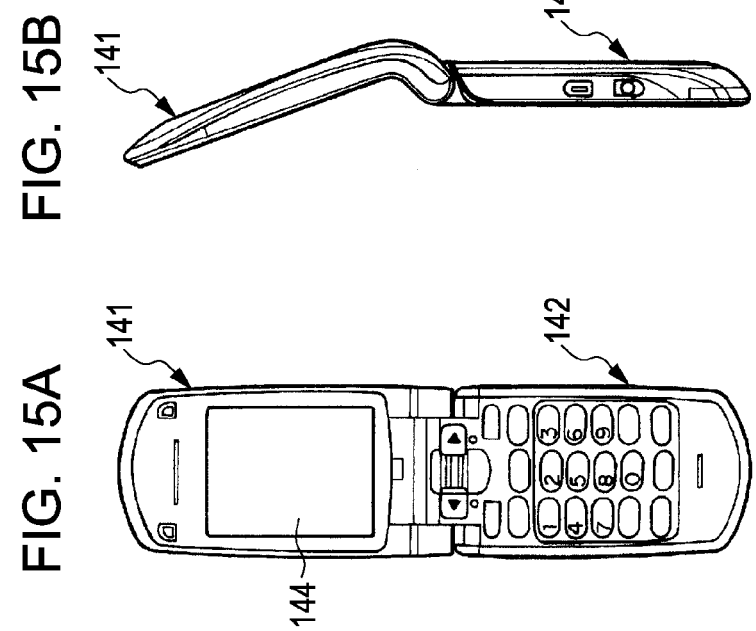

DISPLAY DEVICE AND ELECTRONIC APPARATUS

BACKGROUND OF THE INVENTION

1. Field of the Invention

The present invention relates to a display device provided with storage capacitors which store charges for driving pixels and an electronic apparatus.

2. Description of the Related Art

Display devices such as liquid crystal display devices and organic EL (Electro-Luminescence) display devices include driving substrates for driving pixels. A driving substrate includes drive transistors such as TFT (Thin Film Transistor) formed for driving respective pixels which are arranged in a matrix in an image display region.

In particular, an organic EL display device includes a planarizing insulting film provided below an organic EL light-emitting layer because the organic EL display device has a structure in which a thin organic film is provided between an anode electrode and a cathode electrode. In addition, a drive transistor (TFT) for driving the organic EL light-emitting layer and a storage capacitor for storing charges for holding a luminescent state of the organic EL light-emitting layer are provided for each pixel (refer to Japanese Unexamined Patent Application Publication No. 2007-035964).

SUMMARY OF THE INVENTION

In such a display device, a display electrode of each pixel is provided above an electrode (capacitor electrode) of a storage capacitor through a planarizing insulation film provided on the capacitor electrode. However, planarization is not sufficiently achieved by the planarizing insulation film.

That is, irregularity of the capacitor electrode influences the planarizing insulation film and also influences the display electrode formed on the planarizing insulation film. Such irregularity causes the problem of causing defects in the display electrode and in the light-emitting layer formed thereon and the problem of degrading display quality due to diffraction by internal irregularity when external light or the like is incident on an opening.

It is desirable to sufficiently secure flatness by a planarizing insulation film to improve display quality.

A display device according to an embodiment of the present invention includes a display electrode provided for each pixel, an opening insulation film which covers the periphery of the display electrode and which defines a pixel opening, and a storage capacitor which is disposed below the display electrode through a planarizing insulation film, which as a function to store charges for driving a pixel, and which includes a capacitor electrode wider than the pixel opening.

In the display device, the capacitor electrode of the storage capacitor disposed below the display electrode through the planarizing insulation film has a portion wider than the pixel opening. Therefore, irregularity of the planarizing insulation film, which is produced at the ends of the capacitor electrode, does not influence the inner region of the opening.

In the display device, both a pair of capacitor electrodes which constitute the storage capacitor has a portion wider than a pixel opening. Therefore, irregularity of the planarizing insulation film, which is produced at the ends of the pair of the capacitor electrodes, does not influence the inner region of the opening.

In the display device, among the pair of the capacitor electrodes constituting the storage capacitor, at least the capacitor electrode nearer to the display electrode has a shape corresponding to the shape of a pixel opening. Therefore, irregularity of the planarizing insulation film, which is produced at the ends of the capacitor electrodes, does not influence the inner region of the opening.

In the display device, among the pair of the capacitor electrodes constituting the storage capacitor, at least the capacitor electrode nearer to the display electrode has substantially the same width as that of the display electrode. Therefore, irregularity of the planarizing insulation film, which is produced at the ends of the capacitor electrodes, does not influence the inner region of the opening.

An electronic apparatus according to an embodiment of the present invention includes a display device mounted on a body casing, the display device including a display electrode provided for each pixel, an opening insulation film which covers the periphery of the display electrode and which defines an pixel opening, and a storage capacitor disposed below the display electrode through a planarizing insulation film, having a function to store charge for driving a pixel, and including a capacitor electrode wider than the pixel opening.

In the electronic apparatus, the display device mounted on the body casing includes the storage capacitor disposed below the display electrode through the planarizing insulation film, and the capacitor electrode of the storage capacitor has a portion wider than the pixel opening. Therefore, irregularity of the planarizing insulation film, which is produced at the ends of the capacitor electrode, does not influence the inner region of the opening.

According to an embodiment of the present invention, irregularity of a planarizing insulation film, which is produced at the ends of a capacitor electrode, does not influence the inner region of an opening, thereby sufficiently securing flatness by the planarizing insulation film and improving display quality.

BRIEF DESCRIPTION OF THE DRAWINGS

FIG. 1 is a schematic view illustrating an example of a whole configuration of a display device according to an embodiment of the present invention;

FIG. 2 is a schematic plan view illustrating an example of a configuration of a pixel portion;

FIG. 3 is a schematic sectional view illustrating an example of a configuration of a pixel portion;

FIGS. 15A to 15G are perspective views illustrating a mobile terminal device, for example, a cellular phone, to which an embodiment of the present invention is applied;

DESCRIPTION OF THE PREFERRED EMBODIMENTS

Figure 4A:
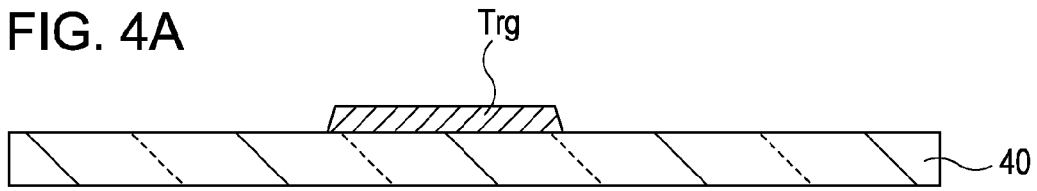
FIGS. 4A to 4D are schematic sectional views illustrating an example of a method for manufacturing a display device according to an embodiment of the present invention.

An embodiment of the present invention is described with reference to the drawings.

Outline of Display Device

FIG. 1 is a schematic plan view illustrating the outlines of a display device according to an embodiment of the present invention. Namely, a display device 1 includes a drive element-forming region 10 provided at substantially the center of a support substrate, for example, a glass substrate, and a power supply part 20, a signal line input part 21, a scanning signal input part 24, and a power control signal input part 25 which are disposed around the drive element-forming region 10. The drive element-forming region 10 includes a plurality of pixel parts 30 which are arranged in a matrix. In a display device which displays color images, a display pixel includes a combination of pixel parts 30 corresponding to, for example, R (red), G (green), and B (blue).

Each of the pixel parts 30 is provided with a drive part 31a including a drive transistor. The drive transistor of the drive part 31a includes a thin film transistor (TFT) formed on a substrate so that a driving object provided in the pixel part 30 is driven by applying a voltage. When the driving object of the pixel part 30 is an organic EL (Electro Luminescence) light-emitting layer, an electric field applied to the organic EL light-emitting layer corresponding to each color is controlled by the drive transistor. When the driving object of the pixel part 30 is a liquid crystal layer, an electric field applied to a liquid crystal is controlled by the drive transistor.

Further, power control lines 22 and scanning lines 23 are connected to the drive transistors so that the drive transistors in the drive element-forming region 10 are sequentially driven by the scanning signal input part 24 to display an image. That is, a power supply voltage is supplied to a horizontal pixel row selected by the scanning lines 23 from the power supply control lines 22, and display is made by a corresponding pixel according to pixel signals input from the signal line input part 21 through the signal lines 26 in the vertical pixel row direction. Therefore, selection of a horizontal pixel line by the scanning lined 23 and input of pixel signals from the signal lines 26 are synchronized to drive the drive element-forming region 10, thereby displaying an image.

A driving substrate 1 is produced through a deposition step of forming layers such as a semiconductor layer, an insulation film layer, and the like on a support substrate by CVD (Chemical Vapor Deposition) or the like, an impurity implanting step, a photolithography step and the like for forming drive elements and patterning wiring.

In this embodiment, circuits are formed in the drive element-forming region 10 of the driving substrate 1 by a division exposure in which the drive element-forming region 10 is divided into a plurality of exposure regions. In the division exposure, one time of exposure is referred to as "shot". In this embodiment, exposure of the drive element-forming region 10 is achieved by a plurality of shots using the same exposure pattern. For example, in a patterning step for producing a display device using organic EL (Electro Luminescence), division exposure is performed with a mask for each layer in order to improve the accuracy of alignment of a plurality of layers.

Configuration of Pixel Part

FIG. 2 is a schematic plan view illustrating an example of a configuration of a pixel part. A plurality of pixel parts 30 are disposed in a display region and partitioned by the scanning lines 23, the power control lines 22, and the signal lines 21. Although a driving object such as an organic EL light-emitting layer, a liquid crystal, or the like is disposed on the pixel parts 30, the driving object is not shown in FIG. 2.

Each of the pixel parts 30 is provided with a write transistor 32, a storage capacitor 33, and a drive transistor 31. In the write transistor 32, the corresponding scanning line 23 is connected to a gate electrode, a drain electrode is connected to the corresponding signal line 21, and a source electrode is connected to a gate electrode of the drive transistor 31 and one of the electrodes of the storage capacitor 33.

The write transistor 32 is turned on by an ON signal input from the corresponding scanning line 23, and the storage capacitor 33 stores pixel signals sent from the corresponding signal line 21. As a result, the drive transistor 31 is turned on to apply a power supply voltage to the driving object.

In the storage capacitor 33, one (capacitor electrode 33a) of the electrodes is connected to the source of the write transistor 32, and the other electrode (capacitor electrode 33b) is connected to the source electrode of the drive transistor 31. The storage capacitor 33 has the function to store pixel signals for a predetermined period and hold a pixel state.

In the display device according to this embodiment, at least one of the pair of capacitor electrodes 33a and 33b constituting the storage capacitor 33 has a portion wider than an opening of a pixel, i.e., an opening (refer to a hatched portion in FIG. 2) formed by an opening insulation film 55 provided in each pixel part 33. In the example shown in FIG. 2, in a portion shown by line III-III, the pair of capacitor electrodes 33a and 33b of the storage capacitor 33 is wider than the opening formed by the opening insulation film 55.

In this example, both the pair of the capacitor electrodes 33a and 33b have portions wider than the opening. However, at least one of the capacitor electrodes 33a and 33b may have a portion wider than the opening.

Both the pair of the capacitor electrodes 33a and 33b most preferably have portions wider than the opening, and the anode electrode-side capacitor electrode of the pair of the capacitor electrodes preferably has a portion wider than the opening. In this way, when the capacitor electrodes 33a and 33b have portions wider than the opening, irregularity of a planarizing insulation film, which is produced at the ends of the capacitor electrodes 33a and 33b, does not influence the inner region of the opening.

Sectional Structure

FIG. 3 is a schematic sectional view illustrating an example of the configuration of a pixel part, taken along line III-III in FIG. 2. FIG. 3 mainly shows a sectional portion of the storage capacitor 33. Namely, a first metal layer 61 is formed in a glass substrate 40, and a second metal layer 62 is formed on the first metal layer 61 through a gate insulation film 41. The storage capacitor 33 includes the first metal layer 61 serving as one 33a of the capacitor electrode 33a and 33b, the second metal layer 62 serving as the other capacitor electrode 33b, and the gate insulation film 41 held between both electrodes.

In addition, a signal line 62B and a power control line 62C are formed as the same layer as the second metal layer 62 on the gate insulation film 41. Further, a passivation film 64 is formed on the second metal layer 62, and a planarizing insulation film 65 is formed on the passivation film 64. Further, an anode electrode 51 is formed on the planarizing insulation film 65, and an opening insulation film 55 is formed to surround the periphery of the anode electrode 51. A portion without the opening insulation film 55 serves as an opening, and an EL layer 50 is deposited on the exposed surface of the anode electrode 51. Further, a cathode electrode 52 is formed over the entire surface.

In such a sectional structure, the first metal layer 61 serving as the capacitor electrode 33 of the storage capacitor 33 and the second metal layer 62 serving as the other capacitor electrode 33b are formed to be wider than the opening formed by the opening insulation film 55. Therefore, the ends of the first and second metal layers 61 and 62 serving as the respective capacitor electrodes 33a and 33b are covered with the opening insulation film 55, and thus a sufficiently flat surface is formed in the opening by the passivation film 64 and the planarizing insulation film 65.

In particular, when the capacitor electrode 33b nearer to the anode electrode 51 has substantially the same width as that of the anode electrode 51, irregularity at the ends of the capacitor electrode 33b does not influence the anode electrode 51. Therefore, the anode electrode 51 formed on the planarizing film 65 also secures sufficient flatness within the opening, and the EL layer 50 is also deposited on a satisfactory flat surface.

Method for Manufacturing Display Device

FIGS. 4A to 5E are schematic sectional views sequentially illustrating an example of a method for manufacturing the display device according to this embodiment. These figures mainly show a drive transistor portion of a drive part. As shown in FIG. 4A, first, a metal such as molybdenum or the like is deposited on an insulating substrate (e.g., a glass substrate 40) by sputtering or the like and then subjected to predetermined patterning to form a gate electrode Trg. The gate electrode Trg is formed at a position corresponding to each of drive transistors so that a plurality of drive transistors are arranged in parallel for the pixel parts.

Figure 4B:
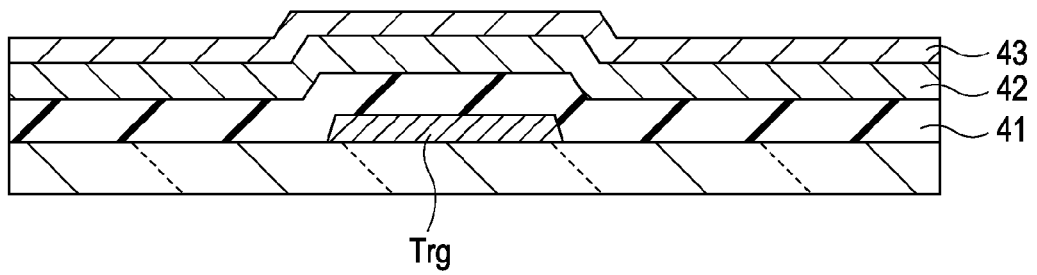

Next, as shown in FIG. 4B, a gate insulation film 41, a semiconductor layer (amorphous silicon) 42, and a buffer oxide film 43 are formed on the gate electrode Trg by, for example, a plasma CVD method. The gate insulation film 41 has a laminated structure including, for example, silicon nitride and silicon oxide. The buffer oxide film 43 includes, for example, a silicon oxide film. These films may be continuously deposited.

Figure 4C:
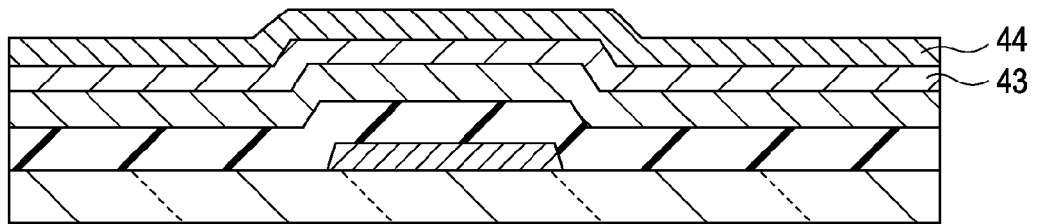
Figure 4D:
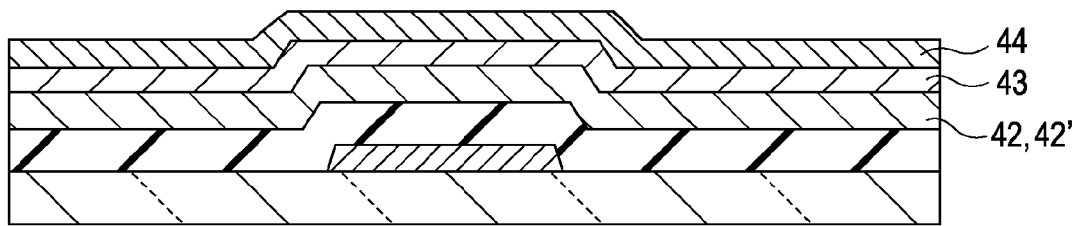

Then, as shown in FIG. 4C, a heat exchange layer 44 is formed on the buffer oxide film 43. The heat exchange layer 44 is composed of, for example, molybdenum and is formed by sputtering or the like.

Then, the heat exchange layer 44 is irradiated with solid-state laser light by scanning. Scanning of solid-state laser light is performed along the direction of arrangement of the drive transistors of the pixel parts. The irradiation width of the solid-state laser light is equivalent to the channel length of the drive transistors or a width including the channel length and an allowance for irradiation position deviation. According to demand, irradiation with the solid-state laser light may be performed by reciprocating scan. As a result, the semiconductor layer (amorphous silicon) 42 is crystallized to form a channel region 42' of each drive transistor.

Figure 5A:
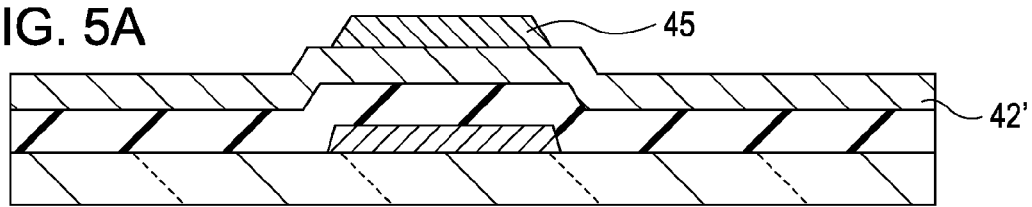
FIGS. 5A to 5E are schematic sectional views illustrating an example of the method for manufacturing a display device in succession of FIG. 4D.
Figure 5B:
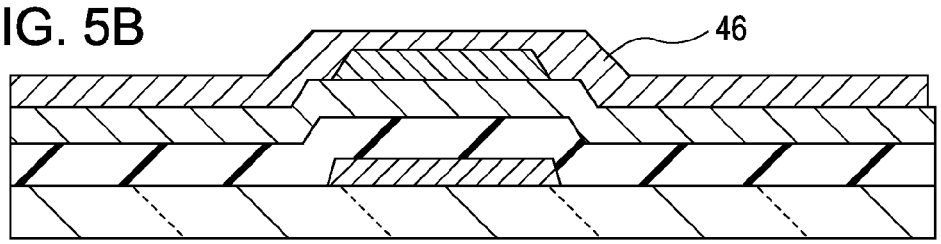
Figure 5C:
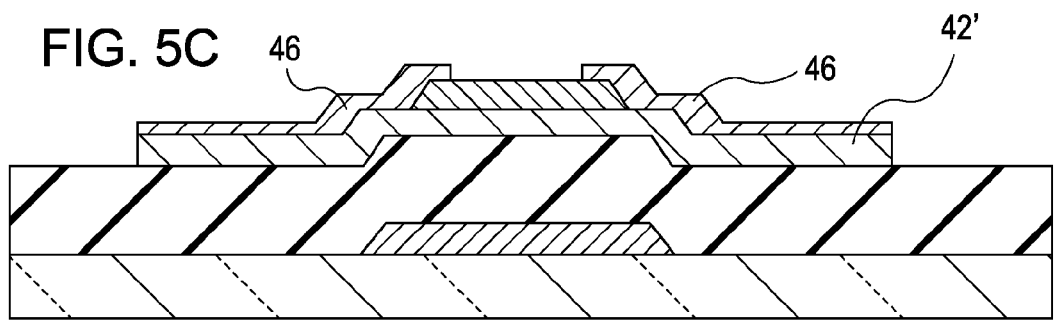

Next, the heat exchange layer 44 and the buffer oxide film 43 are removed. Then, as shown in FIG. 5A, a channel protecting film (etching stopper) 45 is formed on the channel region 42', and as shown in FIGS. 5B and 5C, a n+ layer 46 is deposited, and the n+ layer 46 and the channel region 42' are simultaneously patterned in an island form. The channel protecting film 45 includes, for example, a silicon nitride film and is formed by a plasma CVD method or the like.

Figure 5D:
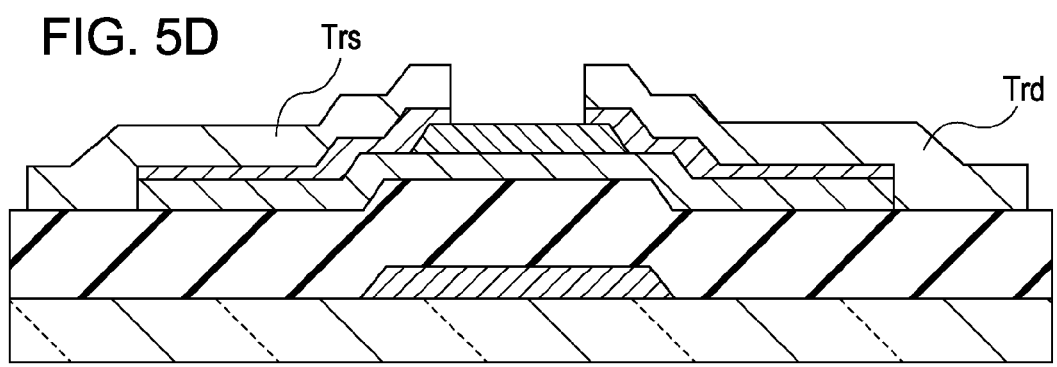
Figure 5E:
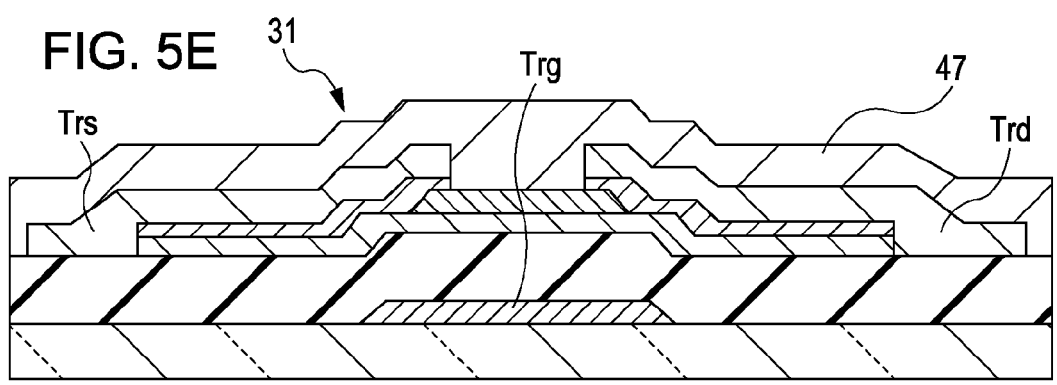

Next, a second metal layer is formed for a source electrode Trs and a drain electrode Trd as shown in FIG. 5D. The second metal layer is subjected to predetermined patterning, and then an insulating protecting film (passivation) 47 is formed as shown in FIG. 5E.

In these steps, the transistor 31 corresponding to each pixel part is formed. A storage capacitor is formed by the same steps. In other words, the capacitor electrode 33a of the storage capacitor is formed using the same metal layer (first metal layer) as that of the gate electrode Trg of the transistor 31, and the other capacitor electrode 33b of the storage capacitor is formed using the same metal layer (second metal layer) as that of the source electrode Trs and the drain electrode Trd of the transistor 31.

In this case, the capacitor electrode 33a of the storage capacitor is connected to the gate electrode Trg of each transistor 31, and the other capacitor electrode 33b of the storage capacitor is connected to the source electrode Trs of each transistor 31.

Other Configurations of Capacitor Electrode

Example 1

Figure 6:
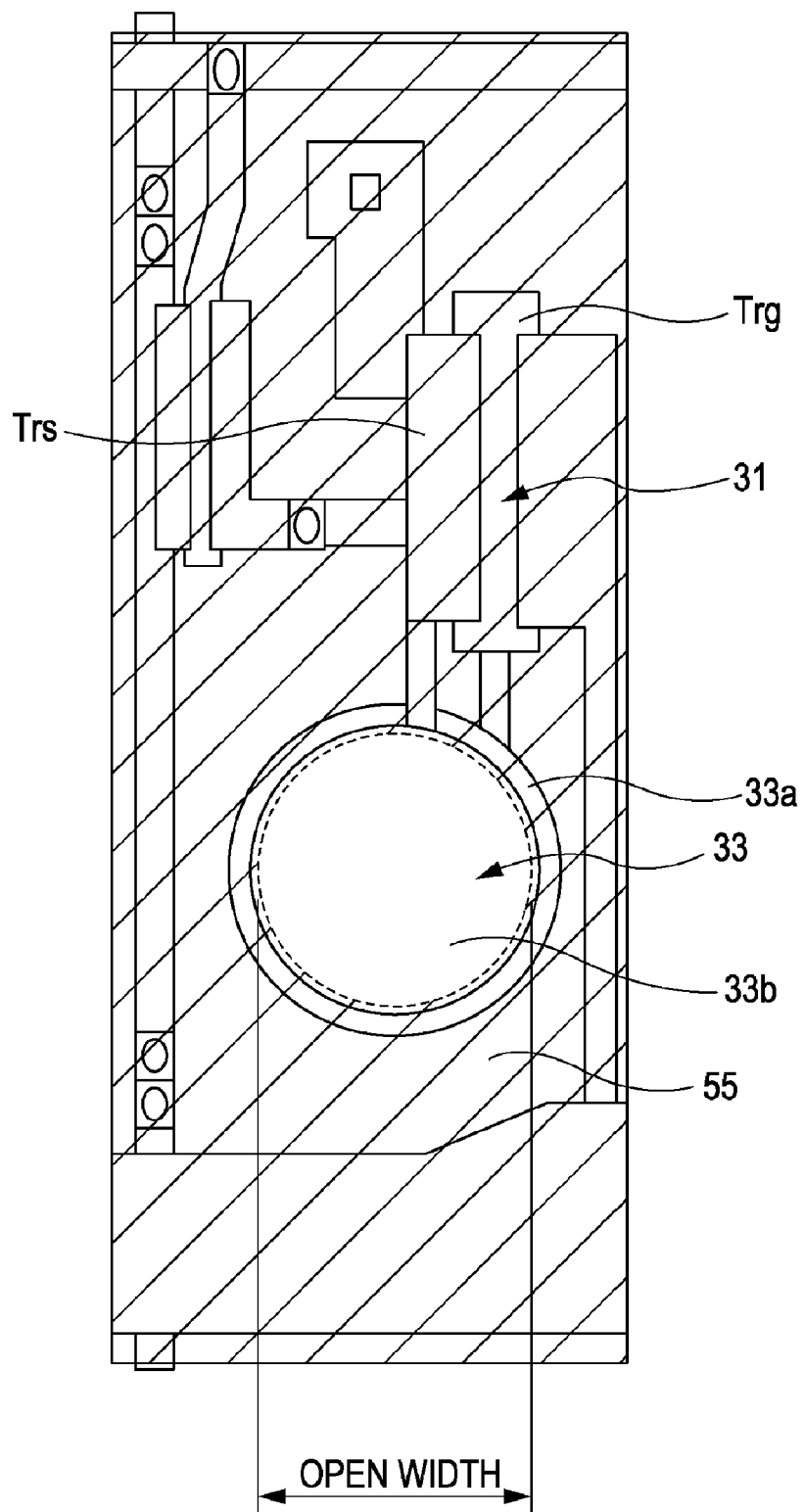
FIG. 6 is a schematic plan view illustrating another configuration of a storage capacitor.

FIG. 6 is a schematic plan view illustrating another configuration (example 1) of a capacitor electrode. In this example, both the capacitor electrodes 33a and 33b shown in FIG. 6 are circular. The capacitor electrode 33a of the storage capacitor 33 is electrically connected to the gate electrode Trg of the drive transistor 31, and the other capacitor electrode 33b is electrically connected to the source electrode Trs of the drive transistor 33.

At least one of the capacitor electrodes 33a and 33b having the above-mentioned shape has a portion wider than the opening formed by the opening insulation film 55 (refer to a hatched portion in FIG. 6). In addition, one 33a of the capacitor electrodes 33a and 33b is slightly larger than the other capacitor electrode 33b. When the capacitor electrodes 33a and 33b are formed in sizes including a lithography margin as a difference in size, the capacitor electrodes 33a and 33b can be securely overlapped even if deviation occurs in lithography.

In addition, the capacitor electrodes 33a and 33b may be formed in a shape corresponding to the shape of the opening formed by the opening insulation film 55. That is, in the example shown in FIG. 6, the opening is circular, and thus the capacitor electrodes 33a and 33b are also formed in a circular shape corresponding to the circular shape of the opening. Therefore, the ends of the capacitor electrodes 33a and 33b are completely covered with the opening insulation film 55, steps formed by the ends in the passivation film, the planarizing insulation film, and the anode electrode do not occur within the opening.

Example 2

Figure 7:
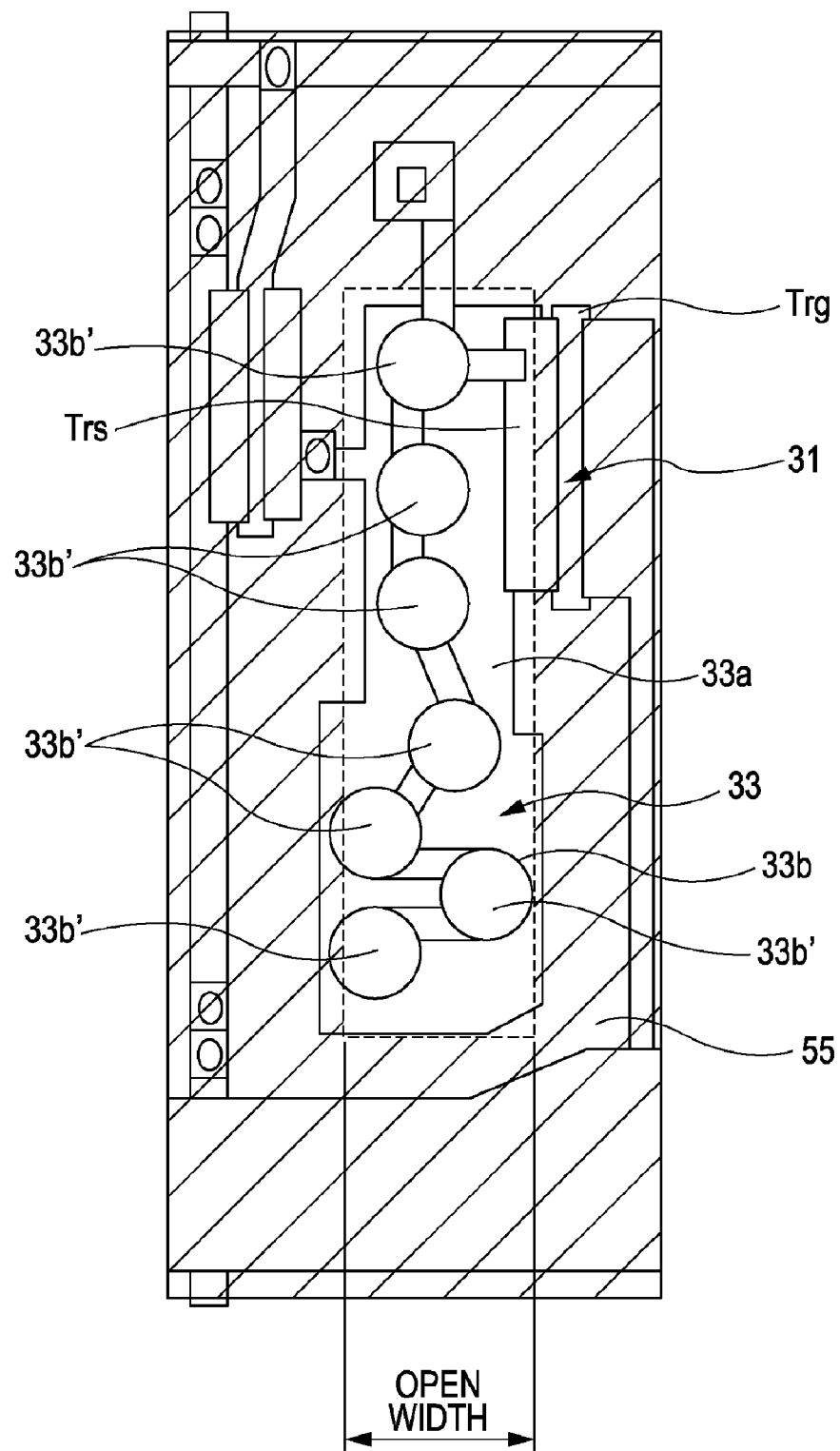
FIG. 7 is a schematic plan view illustrating still another configuration of a storage capacitor.

FIG. 7 is a schematic plan view illustrating still another configuration (example 2) of a capacitor electrode. In this example, the capacitor electrode 33*b* of the capacitor electrodes 33*a* and 33*b* includes a plurality of circular electrodes 33*b'*. On the other hand, the capacitor electrode 33*a* of the storage capacitor 33 is electrically connected to the gate electrode Trg of the drive transistor 31 and is provided in a substantially rectangular shape. The plurality of circular electrodes 33*b'* which constitute the capacitor electrode 33*b* are electrically connected to each other and also electrically connected to the source electrode Trs of the drive transistor 31.

One 33*a* of the capacitor electrodes 33*a* and 33*b* having the above-mentioned shape has a portion wider than the opening formed by the opening insulation film 55 (refer to a hatched portion in FIG. 7). In addition, all the plurality of circular electrodes 33*b'* which constitute the other capacitor electrode 33*b* are disposed within the region of the capacitor electrode 33*a*. When the capacitor electrodes 33*a* and 33*b* are formed, the capacitor electrodes 33*a* and 33*b* can be securely overlapped even if deviation occurs in lithography.

Since one 33*a* of the capacitor electrodes 33*a* and 33*b* has a portion wider than the opening formed by the opening insulation film 55, the ends of the capacitor electrodes 33*a* are covered with the opening insulation film 55, the steps formed by the ends in the passivation film, the planarizing insulation film, and the anode electrode do not occur within the opening.

Example 3

Figure 8:
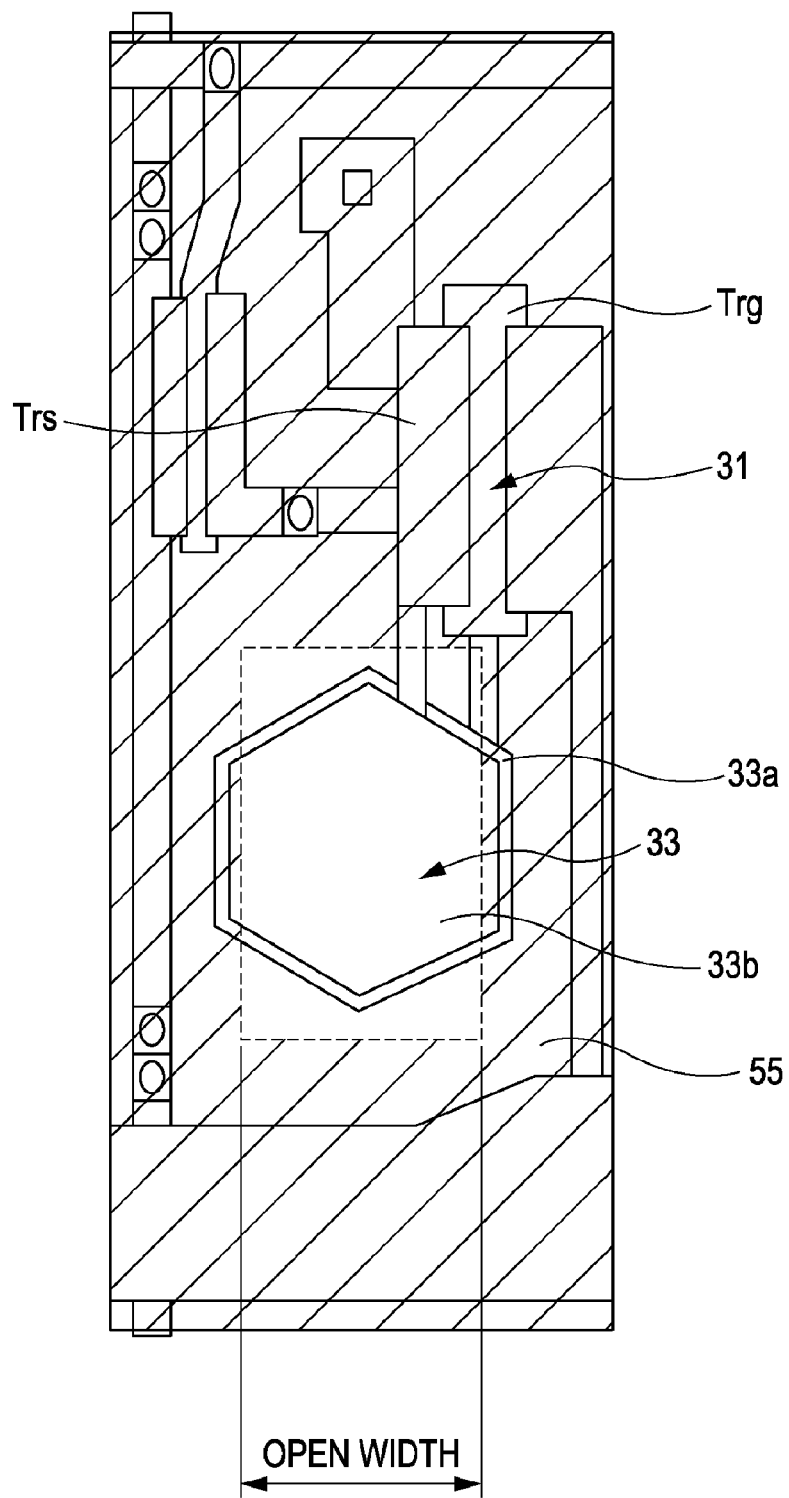
FIG. 8 is a schematic plan view illustrating a further configuration of a storage capacitor.

FIG. 8 is a schematic plan view illustrating a further configuration (example 3) of a capacitor electrode. In this example, both the capacitor electrodes 33*a* and 33*b* shown in FIG. 8 are regular hexagonal. The capacitor electrode 33*a* of the storage capacitor 33 is electrically connected to the gate electrode Trg of the drive transistor 31, and the other capacitor electrode 33*b* is electrically connected to the source electrode Trs of the drive transistor 33.

At least one of the capacitor electrodes 33*a* and 33*b* having the above-mentioned shape has a portion wider than the opening formed by the opening insulation film 55 (refer to a hatched portion in FIG. 8). In addition, one 33*a* of the capacitor electrodes 33*a* and 33*b* is slightly larger than the other capacitor electrode 33*b*. When the capacitor electrodes 33*a* and 33*b* are formed in sizes including a lithography margin as a difference in size, the capacitor electrodes 33*a* and 33*b* can be securely overlapped even if deviation occurs in lithography.

In addition, the capacitor electrodes 33*a* and 33*b* have a portion wider than the opening formed by the opening insulation film 55. Therefore, the ends of the capacitor electrodes 33*a* and 33*b* are covered with the opening insulation film 55, steps formed by the ends in the passivation film, the planarizing insulation film, and the anode electrode do not occur within the opening. Although FIG. 8 shows an example in which the capacitor electrodes 33*a* and 33*b* are regular hexagonal, the capacitor electrodes 33*a* and 33*b* may have any shape as long as the shape is regular polygonal.

Example 4

Figure 9:
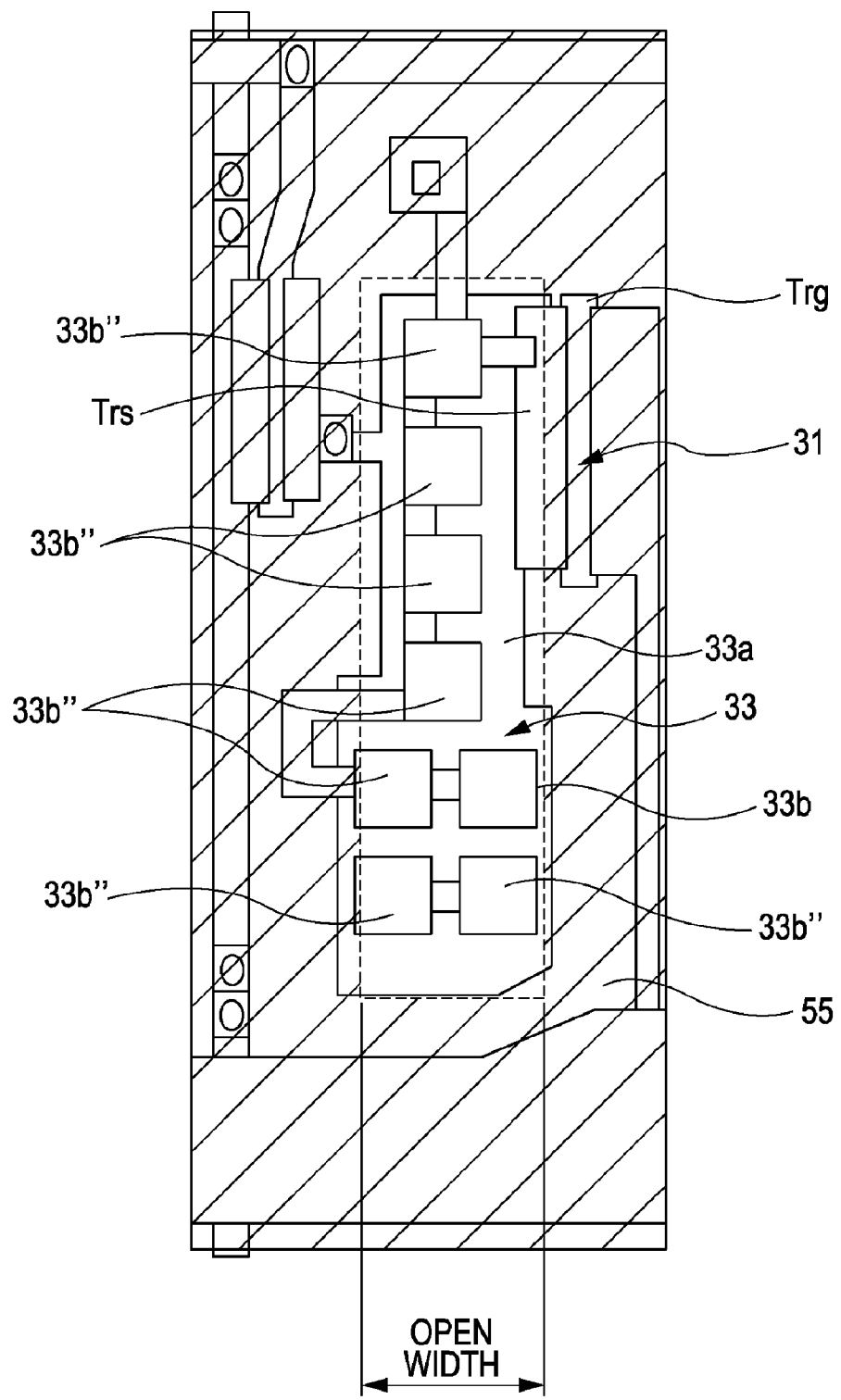
FIG. 9 is a schematic plan view illustrating a further configuration of a storage capacitor.

FIG. 9 is a schematic plan view illustrating a further configuration (example 4) of a capacitor electrode. In this example, the capacitor electrode 33*b* of the capacitor electrodes 33*a* and 33*b* includes a plurality of square electrodes 33*b"*. On the other hand, the capacitor electrode 33*a* of the storage capacitor 33 is electrically connected to the gate electrode Trg of the drive transistor 31 and is provided in a substantially rectangular shape. The plurality of square electrodes 33*b"* which constitute the capacitor electrode 33*b* are electrically connected to each other and also electrically connected to the source electrode Trs of the drive transistor 31.

One 33*a* of the capacitor electrodes 33*a* and 33*b* having the above-mentioned shape has a portion wider than the opening formed by the opening insulation film 55 (refer to a hatched portion in FIG. 9). In addition, all the plurality of square electrodes 33*b"* which constitute the other capacitor electrode 33*b* are disposed within the region of the capacitor electrode 33*a*. Therefore, when the capacitor electrodes 33*a* and 33*b* are formed, the capacitor electrodes 33*a* and 33*b* can be securely overlapped even if deviation occurs in lithography.

Since one 33*a* of the capacitor electrodes 33*a* and 33*b* has a portion wider than the opening formed by the opening insulation film 55, the ends of the capacitor electrodes 33*a* are covered with the opening insulation film 55, and steps formed by the ends in the passivation film, the planarizing insulation film, and the anode electrode do not occur within the opening.

Advantage of Embodiment

In the display device of this embodiment, the ends of the capacitor electrodes 33*a* and 33*b* are covered with the opening insulation film 55 outside the opening of a pixel, and thus the influence of irregularity of the ends on the planarizing insulation film and the like does not occur within the opening. In particular, the capacitor electrode 33*b* nearer to the anode electrode 51 has substantially the same width as that of the anode electrode 51. Therefore, it is possible to improve flatness of the anode electrode 51 without the influence of the irregularity at the ends of the capacitor electrode 33*b* on the anode electrode 51. Since there is no irregularity in the region of the opening, display quality is not decreased by diffraction due to irregularity when external light is incident on the opening.

Next, application examples of the display device according to this embodiment are described below.

Electronic Apparatus

Figure 10:
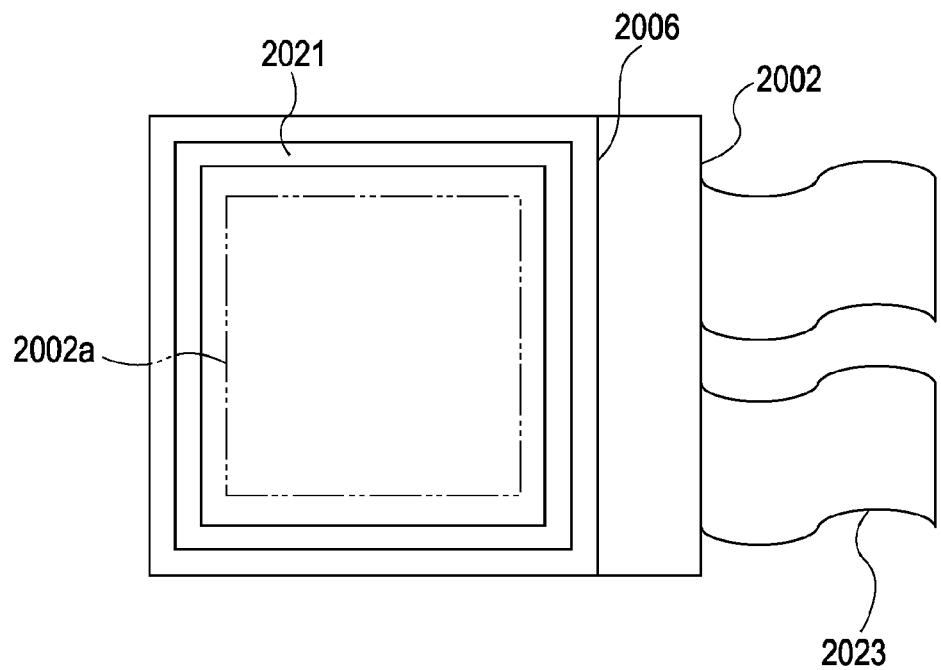
FIG. 10 is a schematic view illustrating an example of a flat-type module shape.

The display device of this embodiment includes a flat-type module shape as shown in FIG. 10. For example, pixels each including a light emission region, a thin film transistor, a light-receiving element, and the like are integrally formed in a matrix to provide a pixel array part 2002*a* on, for example, an insulating substrate 2002. In addition, an adhesive 2021 is disposed to surround the pixel array part (pixel matrix part) 2002*a*, and a counter substrate 2006 such as a glass substrate is attached to form a display module. According to demand, a color filter, a protecting film, a light-shielding film, and the like may be provided on the transparent counter substrate 2006. Further, for example, FPC (flexible printed circuit) 2023 may be provided as a connector for inputting and outputting signals to and from the pixel array part 2002*a* from and to the outside.

The display device according to the embodiment described above can be applied to display devices of various electronic apparatuses shown in FIGS. 11 to 15, such as a digital camera, a notebook-size personal computer, a mobile terminal device such as a cellular phone, a video camera, and the like. Namely, the display device can be applied to electronic apparatuses in any field in which video signals input to an electronic apparatus or video signals generated in an electronic apparatus are displayed as an image or picture. Hereinafter, examples of electronic apparatuses to which the embodiment is applied are described.

Figure 11:
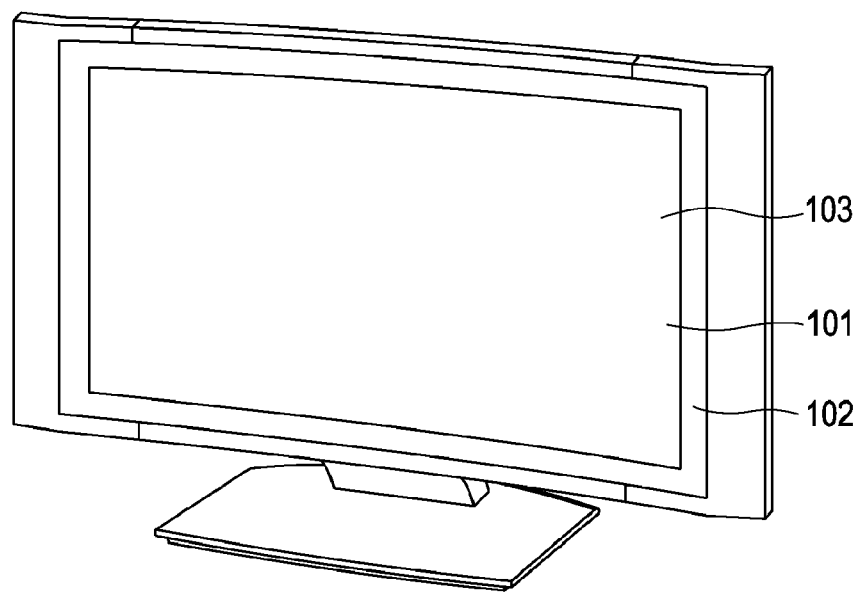
FIG. 11 is a perspective view illustrating a television to which an embodiment of the present invention is applied.

FIG. 11 is a perspective view showing a television to which the embodiment is applied. A television of this application example includes an image display screen 101 including a front panel 102, a filter glass 103, and the like. As the image display screen 101, the display device according to this embodiment is used.

Figure 12A:
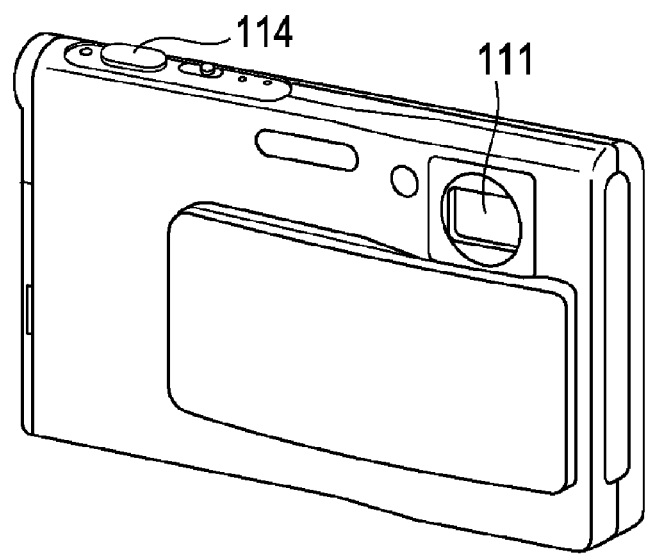
FIGS. 12A and 12B are perspective views illustrating a digital camera to which an embodiment of the present invention is applied.
Figure 12B:
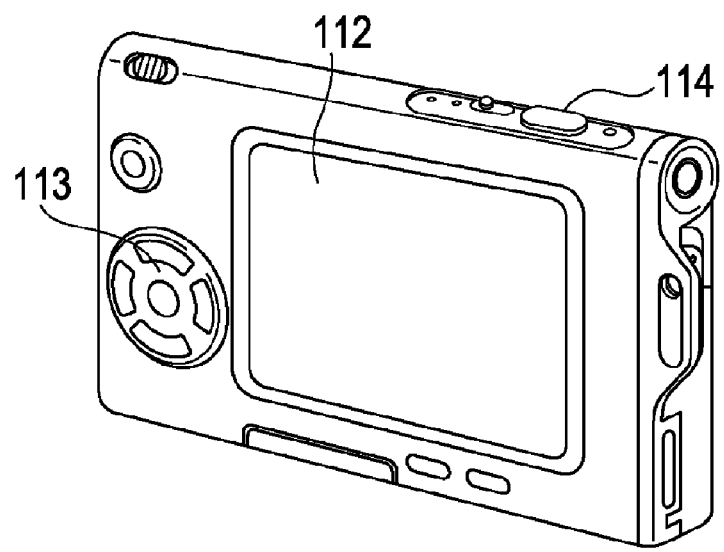

FIGS. 12A and 12B are perspective view showing a digital camera to which the embodiment is applied. FIG. 12A is a front perspective view, and FIG. 12B is a rear perspective view. A digital camera of this application example includes a light-emitting part 111 for flush, a display part 112, a menu switch 113, a shutter bottom 114, and the like. As the display part 112, the display device according to this embodiment is used.

Figure 13:
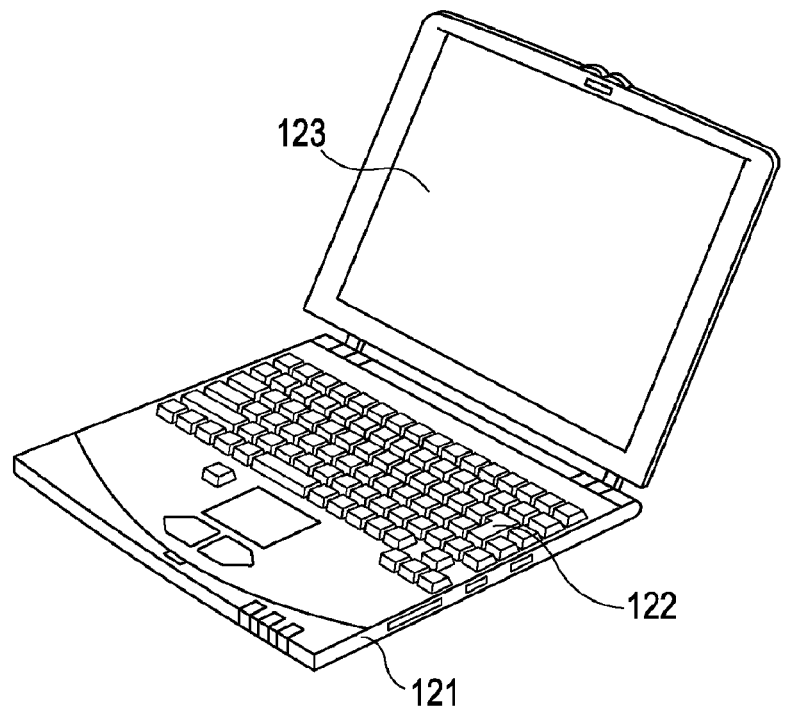
FIG. 13 is a perspective view illustrating a notebook-size personal computer to which an embodiment of the present invention is applied.

FIG. 13 is a perspective view showing a notebook-size personal computer to which the embodiment is applied. A notebook-size personal computer of this application example includes a body 121, a keyboard 122 operated for inputting characters and the like, a display part 123 for displaying images, and the like. As the display part 123, the display device according to this embodiment is used.

Figure 14:
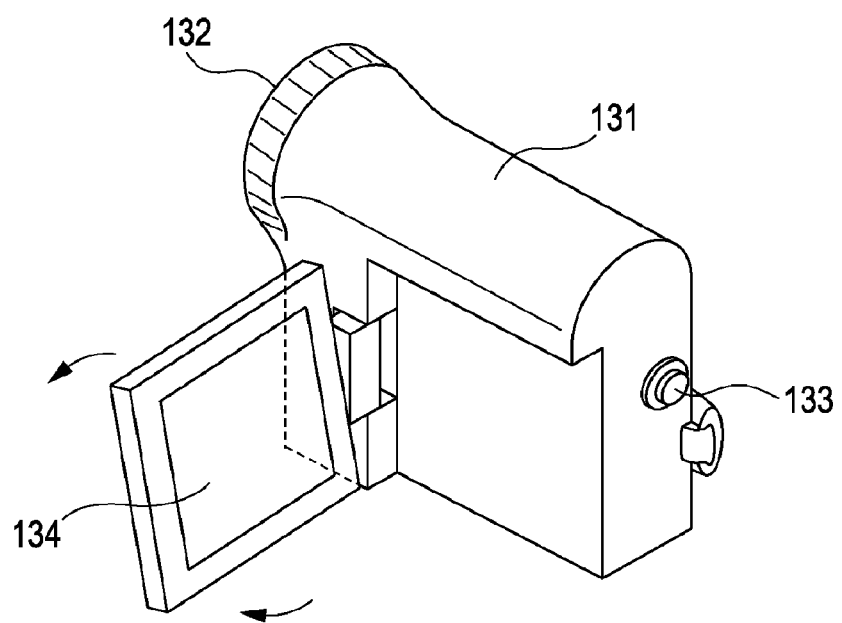
FIG. 14 is a perspective view illustrating a video camera to which an embodiment of the present invention is applied.

FIG. 14 is a perspective view showing a video camera to which the embodiment is applied. A video camera of this application example includes a body 131, an object photographing lens 132 provided on a side facing forward, a start/stop switch 133 for photographing, a display part 134, and the like. As the display part 134, the display device according to this embodiment is used.

FIGS. 15A to 15G are drawings showing a mobile terminal device, for example, a cellular phone, to which the embodiment is applied. FIGS. 15A and 15B are a front view and a side view, respectively, in an open state; and FIGS. 15C, 15D, 15E, 15F, and 15G are a front view, a left side view, a right side view, a top view, and a bottom view, respectively, in a closed state. A cellular phone of this application example includes an upper casing 141, a lower casing 142, a connecting part (here, a hinge) 143, a display 144, a sub-display 145, a picture light 146, a camera 147, and the like. As the display 144 and the sub-display 145, the display device according to this embodiment is used.

Display Imaging Device

Figure 16:
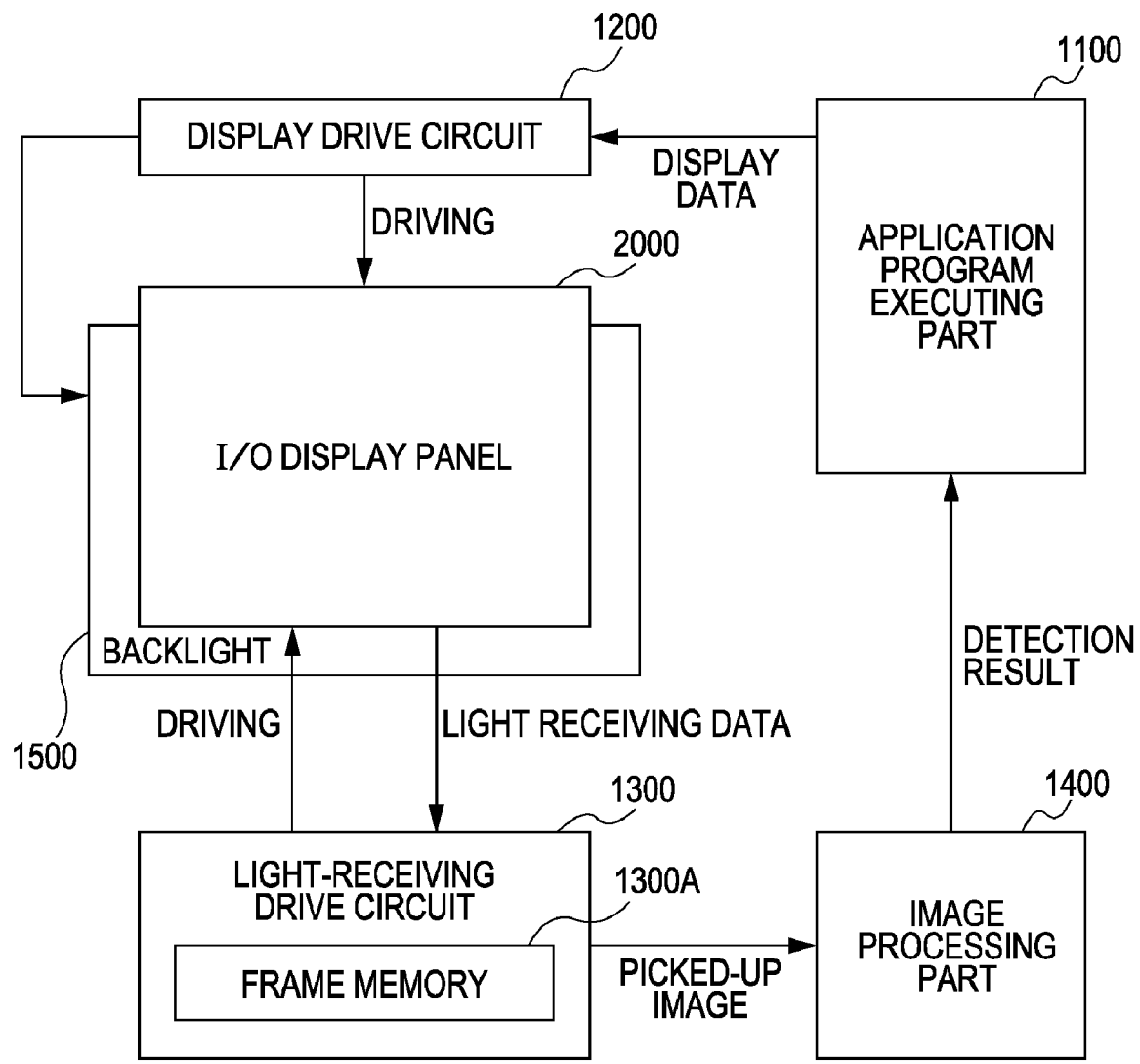
FIG. 16 is a block diagram showing a configuration of a display imaging device.

The display device of this embodiment can be applied to a display imaging device which will be described below. Also, the display imaging device can be applied to the above-described various electronic apparatuses. FIG. 16 shows the whole configuration of a display imaging device. The display imaging device includes an I/O display panel 2000, a backlight 1500, a display drive circuit 1200, a light-receiving drive circuit 1300, an image processing part 1400, and an application program executing part 1100.

The I/O display panel 2000 includes an organic electroluminescence device including a plurality of pixels which are arranged in a matrix over the entire surface and thus has the function (display function) to display images such as a predetermined figure, characters, and the like on the basis of display data by linear sequential operations and the function (imaging function) to image an object in contact with or near the I/O display panel 2000 as described below. The backlight 1500 includes a plurality of light-emitting diodes and serves as a light source for the I/O display panel 2000 so that the backlight 1500 is turned on and off at a high speed at predetermined timing synchronously with the operation timing of the I/O display panel 2000.

The display drive circuit 1200 is a circuit for driving the I/O display panel 2000 (driving by linear sequential operation) so that an image is displayed on the I/O display panel 2000 on the basis of display data (display operation).

The light-receiving drive circuit 1300 is a circuit for driving the I/O display panel 2000 (driving by linear sequential operation) so that light-receiving data is obtained in the I/O display panel 2000 (in order to image an object). The light-receiving data of each pixel is stored in a frame memory 1300A, for example, in units of frame, and is output as a picked-up image to the image processing part 1400.

The image processing part 1400 performs predetermined image processing (arithmetic processing) on the basis of the picked-up image output from the light-receiving drive circuit 1300 to detect information (position coordinate data, data about the shape and size of an object, and the like) about an object in contact with or near the I/O display panel 2000 and acquire the information. The detection processing is described in detail below.

The application program executing part 1100 performs processing according to a predetermined application soft on the basis of the detection results of the image processing part 1400 so that, for example, the position coordinates of an object detected are included in the display data and are displayed on the I/O display panel 2000. The display data produced in the application program executing part 1100 is supplied to the display drive circuit 1200.

Figure 17:
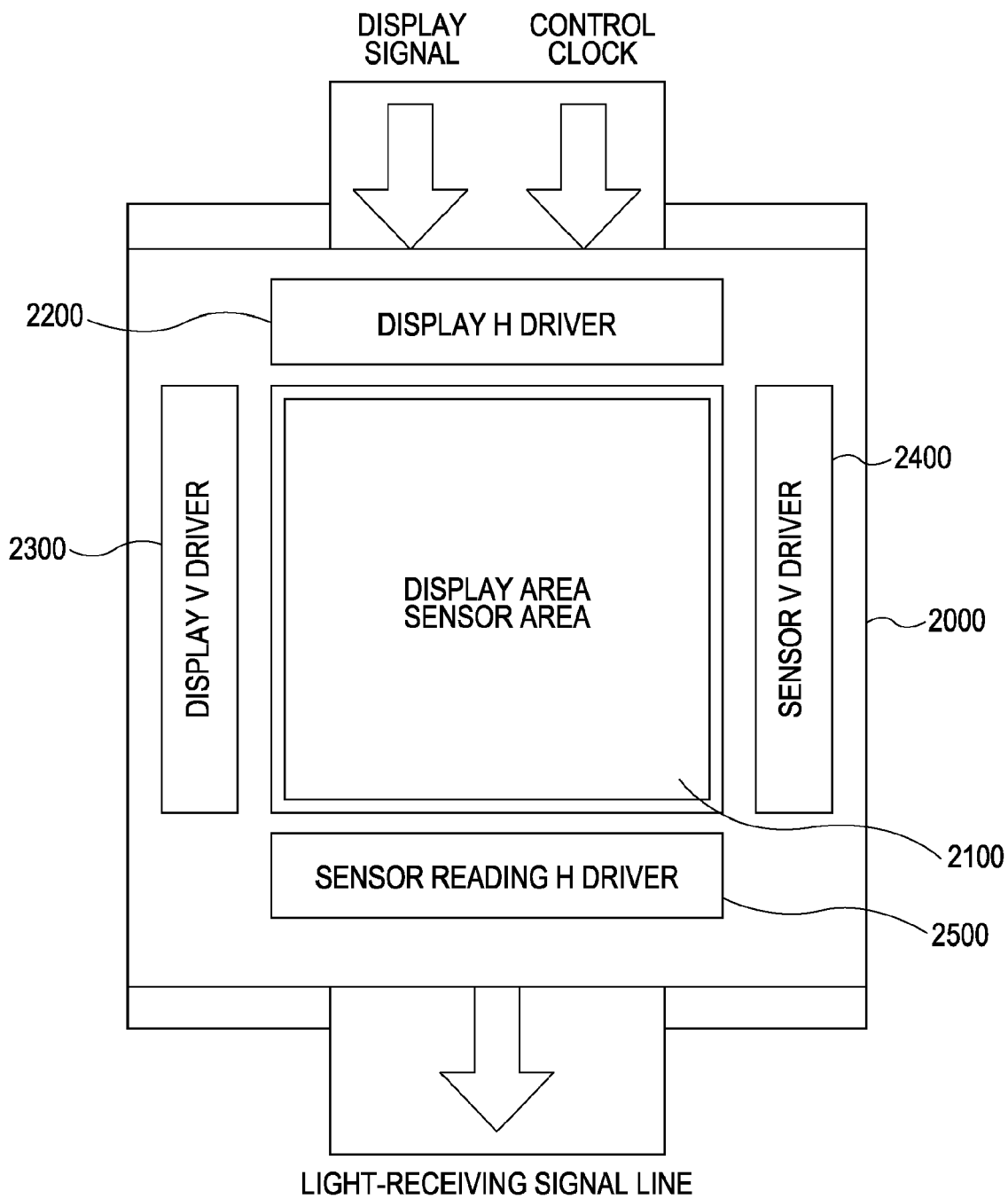
FIG. 17 is a block diagram showing an example of a configuration of an I/O display panel.

Next, an example of a detailed configuration of the I/O display panel 2000 is described with reference to FIG. 17. The I/O display panel 2000 includes a display area (sensor area) 2100, a display H driver 2200, a display V driver 2300, a sensor reading H driver 2500, and a sensor V driver 2400.

The display area (sensor area) 2100 is a region where light from the organic electroluminescence devices is modulated and emitted as display light, and an object in contact with or near the area is imaged. The organic electroluminescence devices serving as light-emitting elements (display elements) and light-receiving elements (imaging elements) are arranged in respective matrixes.

The display H driver 2200 drives the organic electroluminescence devices of pixels within the display area 2100 together with the display V driver 2300 on the basis of display driving display signals supplied from the display drive circuit 1200 and control clocks.

The sensor reading H driver 2500 performs linear sequential driving of light-receiving elements of pixels within the sensor area 2100 in cooperation with the sensor V driver 2400 to acquire light-receiving signals.

Figure 18:
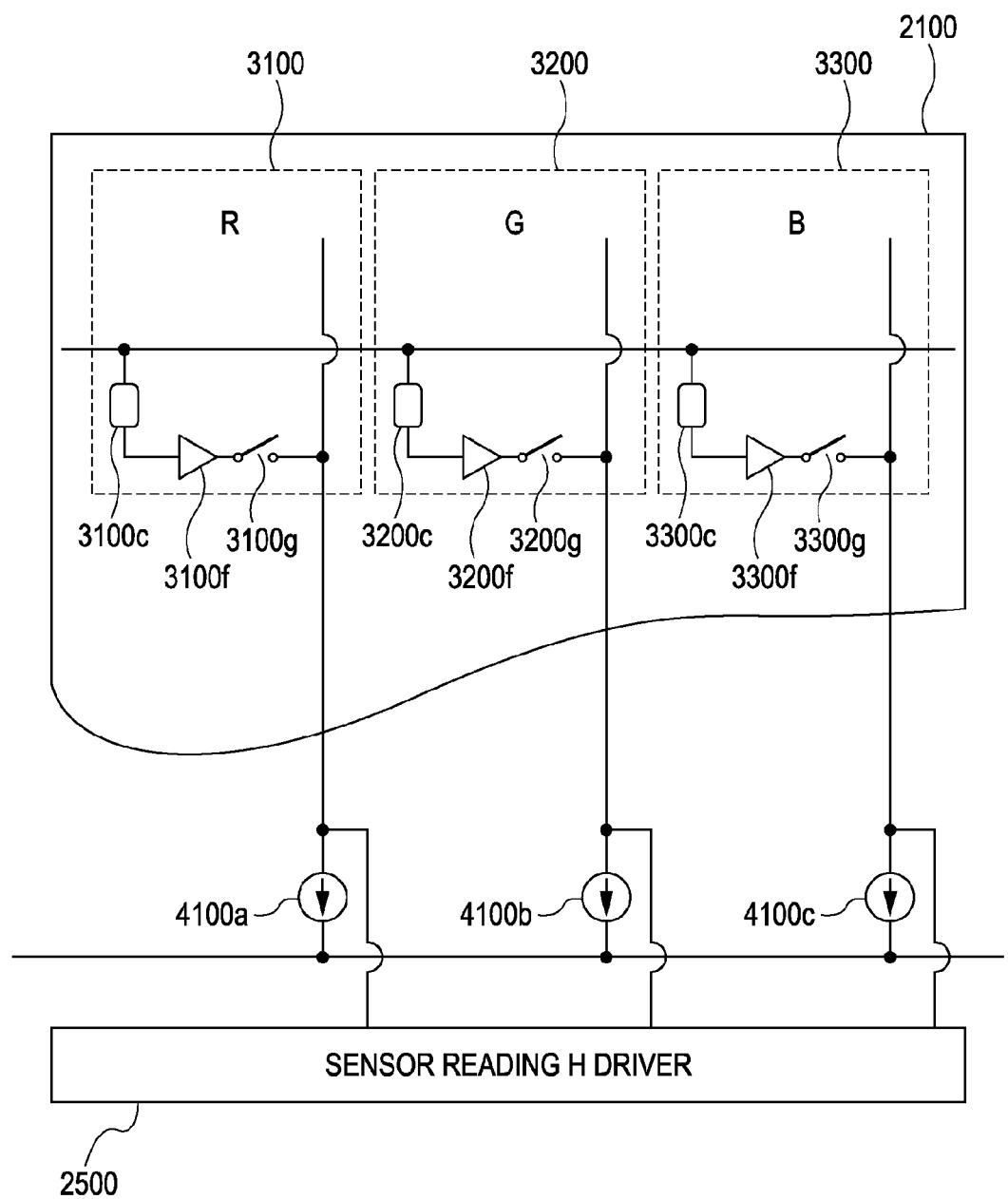
FIG. 18 is a circuit diagram illustrating a relation of connection between each pixel and a sensor reading H driver.

Next, a relation or connection between pixels in the display area 2100 and the sensor reading H driver 2500 is described with reference to FIG. 18. In the display area 2100, red (R) pixels 3100, green (G) pixels 3200, and blue (B) pixels 3300 are arrayed.

The charges accumulated in capacitors connected to light-receiving sensors 3100c, 3200c, and 3300c of the pixels are amplified by buffer amplifiers 3100g, 3200f, and 3300f, respectively, and supplied to the sensor reading H driver 2500 through signal output electrodes at timing when reading switches 3100g, 3200g, and 3300g are turned on. In addition, constant-current sources 4100a, 4100b, and 4100c are connected to the respective signal output electrodes so that signals corresponding to the amounts of light received are detected by the sensor reading H driver 2500 with high sensitivity.

The present application contains subject matter related to that disclosed in Japanese Priority Patent Application JP 2008-131664 filed in the Japan Patent Office on May 20, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a plurality of pixels;
   a display electrode provided for each pixel;
   an opening insulation film for each pixel which covers the periphery of the display electrode and which defines a pixel opening;
   a storage capacitor for each pixel disposed below the display electrode; and
   a planarizing insulation film for each pixel between the display electrode and the storage capacitor,
   wherein,
   the storage capacitor stores charges for driving the pixel,
   the storage capacitor includes a pair of capacitor electrodes, one of which has a portion wider than the pixel opening,
   at least the capacitor electrode nearest to the display electrode has a shape corresponding to the shape of the pixel opening, and
   at least the capacitor electrode nearest to the display electrode has substantially the same width as that of the pixel opening.

2. An electronic apparatus comprising a display device mounted on a body casing, wherein:
   the display device includes (a) a plurality of pixels, (b) a display electrode provided for each pixel, (c) an opening insulation film for each pixel which covers the periphery of the display electrode and which defines a pixel opening, (d) a storage capacitor for each pixel which is disposed below the display electrode, and (e) a planarizing insulation film for each pixel between the storage capacitor and the display electrode;
   the storage capacitor stores charges for driving the pixel,
   the storage capacitor includes a pair of capacitor electrodes, one of which is wider than the pixel opening,
   at least the capacitor electrode nearest to the display electrode has a shape corresponding to the shape of the pixel opening, and
   at least the capacitor electrode nearest to the display electrode has substantially the same width as that of the pixel opening.

* * * * *